(12) United States Patent
Lin et al.

(10) Patent No.: US 7,924,401 B2
(45) Date of Patent: *Apr. 12, 2011

(54) SEAL RING ARRANGEMENTS FOR IMMERSION LITHOGRAPHY SYSTEMS

(75) Inventors: Burn Jeng Lin, Hsinchu (TW); Tsai-Sheng Gau, Hsinchu (TW); Chun-Kuang Chen, Hsinchu (TW); Ru-Gun Liu, Hsinchu (TW); Shinn Sheng Yu, Hsinchu (TW); Jen Chieh Shih, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/413,194

(22) Filed: Mar. 27, 2009

(65) Prior Publication Data

US 2009/0180087 A1    Jul. 16, 2009

Related U.S. Application Data

(63) Continuation of application No. 11/522,611, filed on Sep. 18, 2006, now Pat. No. 7,517,639, which is a continuation-in-part of application No. 10/874,982, filed on Jun. 23, 2004, now Pat. No. 7,501,226.

(60) Provisional application No. 60/742,701, filed on Dec. 5, 2005.

(51) Int. Cl.
    *G03B 27/52*    (2006.01)
(52) U.S. Cl. .......................... 355/30; 355/53; 430/311
(58) Field of Classification Search .................. None
    See application file for complete search history.

(56) References Cited

U.S. PATENT DOCUMENTS

| 7,517,639 B2 * | 4/2009 | Lin et al. ............... 430/311 |
| 2004/0075895 A1 | 4/2004 | Lin |
| 2004/0160582 A1 * | 8/2004 | Lof et al. ............... 355/30 |
| 2005/0264778 A1 * | 12/2005 | Lof et al. ............... 355/53 |

FOREIGN PATENT DOCUMENTS

JP    2004289127    10/2004

OTHER PUBLICATIONS

Soichi, Owa et al., "Immersion Lithography Tool Update", Sematech 3rd Immersion Workshop, Jul. 2003, pp. 1-51.
2005-0481 JP 1st OA 20091125.

* cited by examiner

*Primary Examiner* — Daborah Chacko Davis
(74) *Attorney, Agent, or Firm* — K&L Gates LLP

(57) ABSTRACT

Various seal ring arrangements for an immersion lithography system are disclosed. With the seal ring arrangements, the immersion lithography system can provide better sealing effect for processing the wafers on a wafer chuck.

17 Claims, 12 Drawing Sheets

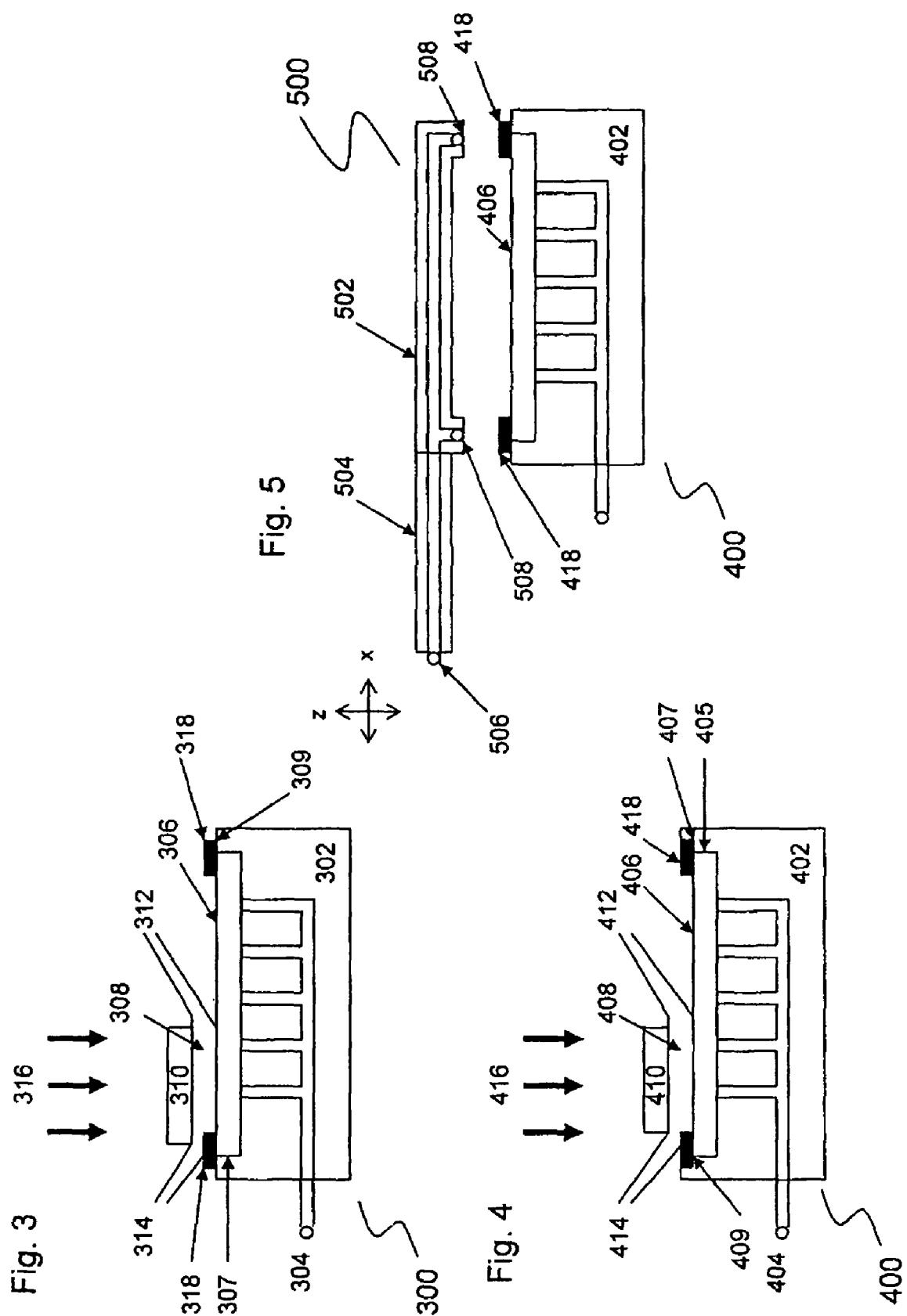

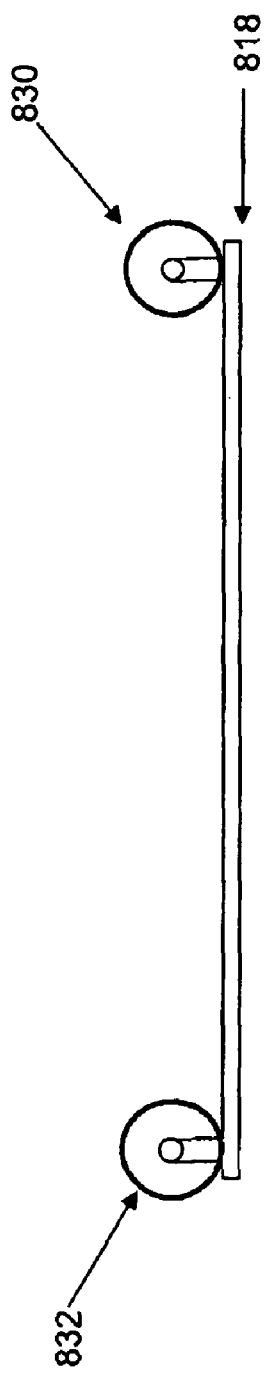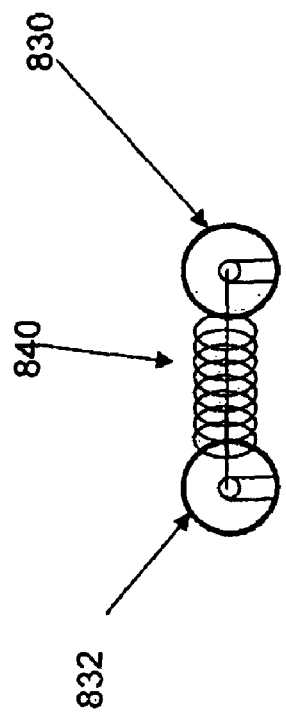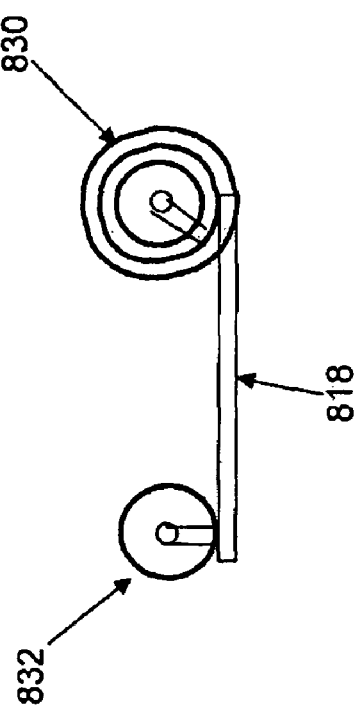
Fig. 8B
Fig. 8C
Fig. 8D

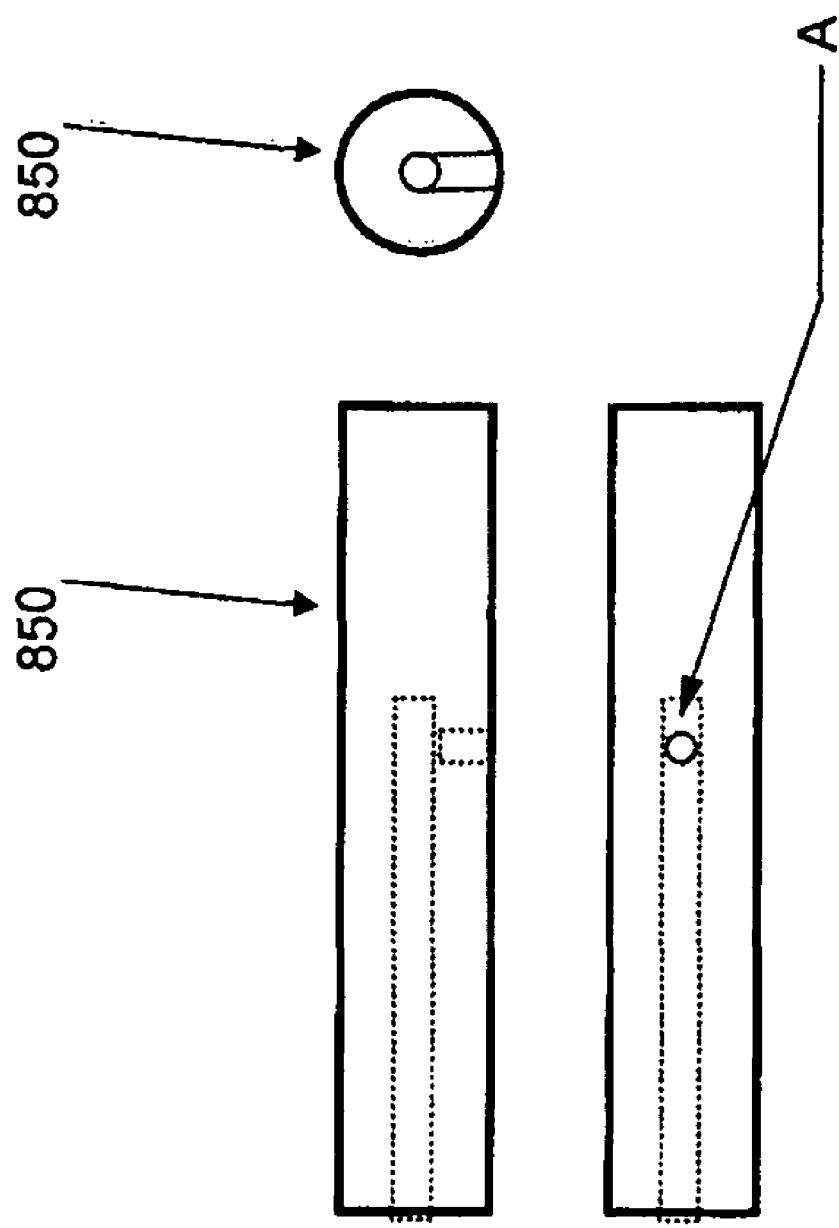

SEAL RING ARRANGEMENTS FOR IMMERSION LITHOGRAPHY SYSTEMS

CROSS REFERENCE

The present application is a continuation application of U.S. application Ser. No. 11/522,611 which was filed on Sep. 18, 2006 now U.S. Pat. No. 7,517,639 entitled "SEAL RING ARRANGEMENTS FOR IMMERSION LITHOGRAPHY SYSTEMS" which in turn is a continuation-in-part application of U.S. application Ser. No. 10/874,982 which was filed on Jun. 23, 2004 now U.S. Pat. No. 7,501,226 entitled "IMPROVED IMMERSION LITHOGRAPHY SYSTEM WITH WAFER SEALING MECHANISMS" and also claims the benefits of U.S. Provisional Application Ser. No. 60/742,701, which was filed on Dec. 5, 2005 entitled "SEAL RING ARRANGEMENT FOR IMMERSION LITHOGRAPHY SYSTEM", the content of all applications is herein incorporated by reference.

BACKGROUND

The present disclosure relates generally to an immersion lithography system used for the manufacture of semiconductor devices, and more particularly to the seal ring carrier of the immersion lithography system.

The manufacture of very large-scale integrated (VLSI) circuits requires the use of many photolithography process steps to define and create specific circuits and components onto the semiconductor wafer (substrate) surface. Conventional photolithography systems comprise of several basic subsystems, a light source, optical transmission elements, photo mask reticles, and electronic controllers. These systems are used to project a specific circuit image, defined by the mask reticles, onto a semiconductor wafer coated with a light sensitive film (photoresist) coating. As VLSI technology advances to higher performance, circuits become geometrically smaller and denser, requiring lithography equipment with lower resolution (smaller feature size) projection and printing capability. Such equipment is now required to be capable of producing features with feature resolutions smaller than 100 nanometers (nm). As new device generations are developed requiring even further improvements, of feature resolutions 65 nm and lower, major advancements to photolithography processing are required.

Immersion lithography has been implemented to take advantage of the process technology's capability for much improved resolution. Immersion lens lithography features the usage of a liquid medium to fill the entire gap between the last objective lens element of the light projection system and the semiconductor wafer (substrate) surface during the light exposure operations of the photoresist pattern printing process. The liquid medium used as the immersion lens provides an improved index of refraction for the exposing light, thus improving the resolution capability of the lithographic system. This is represented by the Rayleigh Resolution formula, $R = k_1 \lambda / N.A.$, where R (feature size resolution) is dependant upon $k_1$ (certain process constants), $\lambda$ (wavelength of the transmitted light) and the N.A. (Numerical Aperture of the light projection system). It is noted that N.A. is also a function of the index of refraction where $N.A. = n \sin \theta$. Variable n is the index of refraction of the liquid medium between the objective lens and the wafer substrate, and is $\theta$ the acceptance angle of the lens for an imaging light.

It can be seen that as the index of refraction (n) becomes higher for a fixed acceptance angle, the numerical aperture (N.A.) of the projection system becomes larger thus providing a lower R value, i.e. a higher resolution. Conventional immersion lithographic systems utilize de-ionized water as the immersion fluid between an objective lens and the wafer substrate. At one of the wavelengths, for example 193 nm, de-ionized water at 20 degree Celsius has an index of refraction at approximately 1.44 versus air, which has an index of refraction at approximately 1.00. It can be seen that immersion lithographic systems utilizing de-ionized water as the immersion fluid, offers a significant improvement to the resolution of the photolithography processes.

One challenge of utilizing the immersion lithography system is to seal the wafer on a wafer chuck/stage. A seal ring is used for protecting the wafer from fluid turbulence and particulate contamination. However, the seal ring needs frequent cleaning to get rid of the particles. Frequent loading and unloading of the seal ring and/or the wafer demands for an appropriate carrier mechanism to operate with the seal ring.

What is desired is an improved seal ring arrangement for the immersion lithography operations.

SUMMARY

In view of the foregoing, the present disclosure provides an improved system that minimizes the introduction of particles into the immersion fluid by preventing the immersion fluid from contact with the particulate contamination areas. The system also helps to maintain the integrity of the photoresist image and pattern on the wafers such that they do not become distorted and defective.

Various seal ring arrangements for an immersion lithography system are disclosed. With the seal ring arrangements, the immersion lithography system can provide better sealing effect for processing the wafers on a wafer chuck.

The construction of the invention, however, together with additional objects and advantages thereof will be best understood from the following description of exemplary embodiments when read in connection with the accompanying drawings.

BRIEF DESCRIPTION OF THE DRAWINGS

FIG. 3 illustrates a cross-sectional view of one example of the disclosed immersion lithography system for processing on the wafer substrate edge area.

FIG. 4 illustrates a cross-sectional view of a second example of the disclosed immersion lithography system for processing on the wafer substrate edge area.

FIG. 5 illustrates a cross-sectional view of an example of the disclosed seal ring carrier incorporated into the immersion lithography system.

FIGS. 8A-8F illustrate a seal ring carrier with rollers for rolling up the seal ring for an immersion lithography system in accordance with an embodiment of the present disclosure.

DESCRIPTION

The present disclosure provides an improved system and method for sealing and controlling of the immersion fluid within an immersion area throughout the entire immersion lithography exposure processing. The disclosed seal ring arrangement has a seal ring device to facilitate the sealing and containment of the immersion fluid to the wafer substrate and immersion fluid reservoirs by covering the wafer substrate edge. The disclosed seal ring is placed and removed from operating position through the use of a disclosed seal ring carrier device. The present disclosure provides several examples of how the seal ring may be handled with the immersion lithography system. In addition, the present disclosure provides several examples of seal ring carrier designs, which may be used with the disclosed immersion lithography system.

Figure 1:
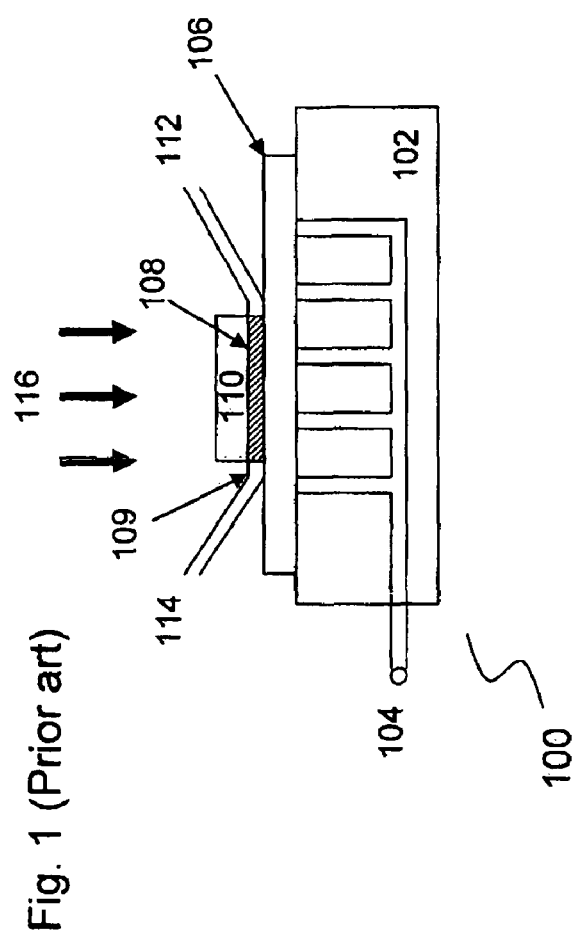
FIG. 1 illustrates a cross-sectional view of a conventional immersion lithography system.

FIG. 1 is a cross-sectional diagram that illustrates a typical immersion lithography system. The immersion printing section 100 of the lithography system contains a movable wafer chuck/stage 102 incorporated with vacuum channels 104 for holding and fixing the photoresist coated wafer 106 onto the top of the wafer chuck/stage 102. The immersion fluid 108 is shown located on top of the photoresist coated wafer 106 displacing the entire volume of space between the wafer and the last objective lens element 110 of the lithography's light projection system. The immersion fluid 108 is in direct contact with both the top surface of the photoresist coated wafer 106 and the lower surface of the objective lens element 110.

There are two fluid reservoirs directly connected to the fluid of the water immersion area 109. A fluid supply reservoir 112 serves as the means for supplying and injecting the immersion fluid into the immersion area 109 just under the objective lens element 110. The injected immersion fluid is either held by capillary forces in immersion area 109 or contained within a fixture moving with the lens. A typical thickness of the immersion fluid is between 1 to 5 millimeters (mm). A fluid recovery reservoir 114 serves as the means for recovering and accepting the output fluid flow from the immersion fluid 108. It is understood that the immersion fluid flow may go from the fluid supply reservoir 112, through the immersion area 109, and out to the fluid recovery reservoir 114. There may be associated mechanical hardware and electrical/electronic controllers by which the flow of immersion fluid as described above, is managed and controlled. The large downward arrows 116 of FIG. 1 located above the lithography system's last objective lens element 110 represents the direction of and the transmission of the pattern image-exposing light 116 towards the objective lens element 110 and through the immersion lens 110 to the photoresist coated wafer 106. During normal operation of the immersion lithography printing of the photoresist coated wafer 106, the wafer chuck 102 moves to position each exposure target area of the wafer under the fixed locations of the immersion fluid 108, the fluid reservoirs 112 and 114, the objective lens element 110 and the pattern image-exposing light 116.

Figure 2:
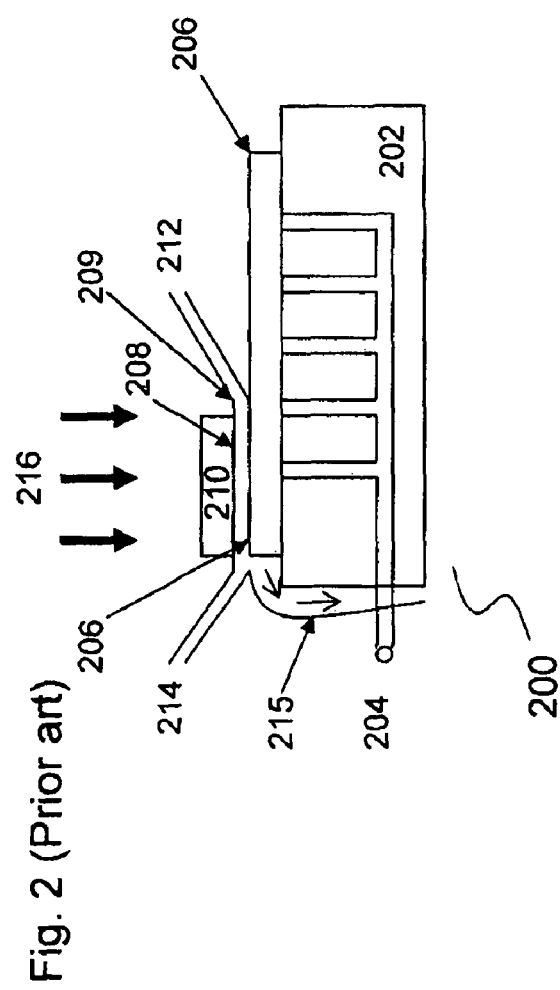
FIG. 2 illustrates a cross-sectional view of the conventional immersion lithography system of FIG. 1 while processing at a wafer substrate edge area.

The typical immersion lithography system as configured and described by FIG. 1 is effective for performing the immersion lithography process operations. There are several issues with the practical aspects of the physical configurations and procedures that may influence the quality of the immersion lithography process as well as the operational efficiency of the system. FIG. 2 helps to illustrate these issues. FIG. 2 is a cross-sectional diagram of a typical immersion lithography system, similar to FIG. 1, but showing the hardware component locations during processing at the edge of the wafer substrate. The immersion printing section 200 of the lithography system is shown with the movable wafer chuck/stage 202 incorporated with vacuum channels 204 for holding and fixing the photoresist coated wafer 206 onto the top of the wafer stage 202. The immersion fluid 208 is shown located on top of the photoresist coated wafer 206 displacing the entire volume of space between the wafer and the last objective lens element 210 of the lithography's light projection system. The fluid 208 is in direct contact with both the top surface of the photoresist coated wafer 206 and the lower surface of the objective lens element 210. The two fluid reservoirs, the fluid supply reservoir 212 and the fluid recovery reservoir 214, are connected to the fluid 208.

The immersion fluid 208 is shown located at the edge of the wafer substrate 206 to perform processing upon the photoresist areas at the wafer edge. At the wafer substrate edge, the normally closed-loop flow of the immersion fluid from the fluid supply reservoir 212, through the immersion area 209 to the fluid recovery reservoir 214 is different than that previously described for FIG. 1. As shown in FIG. 2, there is now an additional path 215 for the output flow of the immersion fluid, which occurs when processing at the wafer substrate edge. This additional path 215 allows the immersion fluid 208 to flow out of the immersion area 209 and not returning back into the fluid recovery reservoir 214.

This uncontrolled, non-containment of immersion fluid affects the quality of the immersion lithography process in several ways. For example, rapid loss of fluid produces a cooling effect especially near the edge of the wafer. As a result, the wafer is shrunken in nanometer scale near its edge at where the rapid flow of fluid occurs, inadvertently affecting overlay accuracy of the exposed pattern to the underlying pattern created in the previous masking process. Secondly, the fluid tends to be drawn between the wafer and the wafer chuck. Fluid evaporation in such areas further produces non-uniform cooling under the wafer to further reduce the overlay accuracy.

More specifically, the wafer edge position of the immersion lens 210 also exposes the immersion lithography processing to certain quality issues. During normal wafer processing within the semiconductor processing facilities, the wafer edges have a high propensity to collect particulate contamination. This is due to the fact that the wafer edge is handled more and in closer proximity to particulate generation sources than the interior areas of the wafer substrate. As shown by FIG. 2, when the wafer chuck/stage 202 positions the wafer substrate edge 206 under the immersion lens 210, the immersion fluid 208 contacts particulates located at the wafer substrate edge 206. As result, the particulates may become dislodged from the wafer substrate surface 206 and become suspended within the fluid 208. These particulates may then affect the immersion lithography exposing processes enough to distort and disturb the printed image patterns on the wafer substrate. They may also deposit and adhere onto the wafer substrate surface to affect subsequent wafer processing operations. The flow of the immersion fluid 208 to the recovery reservoir 214 and the additional flow 215 out of the immersion area 209 may not be able to keep the particulates from affecting the immersion lithography and subsequent processing operations. Fluid turbulence also moves particles around the fixtures near the wafer edge and other places such as the top, side, and bottom of the wafer. Some of these particles remain on the wafer to become particle-related defects. Furthermore, the fluid turbulence produces bubbles that can be printed into the photoresist and become bubble-induced defects.

Since the immersion fluid is not fully recovered, it is wasted as it flows away from the immersion lens 210 and immersion fluid reservoirs. Mechanisms can be provided to collect the fluid to prevent the mechanical and electrical components of the wafer chuck 202 and other underlying assemblies from being undesirably wetted from the additional flow 215 of immersion fluid that may contaminate and shorten the operational life of the system's hardware and electrical components. However, the added collection mechanisms cannot alleviate the loss of overlay accuracy and the extra undesirable defects introduced such as the particle or bubble related defects.

FIG. 3 illustrates an example of the seal ring integrated with the immersion lithography system in accordance with the present disclosure. The immersion printing section 300 of the lithography system is shown with the movable wafer chuck/stage 302 incorporated with vacuum channels 304 for holding and fixing the photoresist coated wafer 306 onto the top of the wafer stage 302. The wafer chuck/stage 302 is constructed with a recess 307, approximately matching the circumference and thickness of the wafer substrate 306 while leaving room to accommodate wafer size variations, from the top surface to accommodate the placement of the wafer substrate 306 such that the top surface of the wafer substrate 306 is position leveled and flushed (or co-planar) to the top surface of the non-recessed portion of the wafer chuck/stage 302. The immersion fluid 308 is shown located on top of the photoresist coated wafer 306 displacing at least a partial volume of space between the wafer and the last objective lens element 310 of the lithography's light projection system. In some operation of the immersion lithography, the fluid is in direct contact with both the top surface of the photoresist coated wafer 306 and the lower surface of the objective lens element 310. The two fluid reservoirs, the fluid supply reservoir 312 and the fluid recovery reservoir 314, along with other accessories for holding the immersion fluid 308 in the space between the wafer and the lens element 310 may be collectively referred to as a fluid containing feature.

The immersion fluid 308 is shown located at the edge of the wafer substrate 306 to perform processing upon the photoresist areas. At the wafer substrate 306 edge, a seal ring 318 has been placed into position on top of the wafer substrate 306 surface such that the seal ring 318 is in contact with the outer edge of the wafer substrate 306, overlapping and also in contact with a small portion 309 of the wafer chuck/stage 302 that is located adjacent to the wafer substrate 306 edge. The disclosed seal ring 318 confines the immersion fluid within the immersion area 308. The disclosed seal ring 318 prevents the additional flow of immersion fluid out of the water immersion area 318 and from the immersion fluid reservoir areas 312 and 314. As the seal ring 318 confines the immersion fluid, the flow and usage of the fluid is very well controlled and maintained. The fluid flows and usage are substantially the same for the immersion lithography processing at both, the wafer substrate interior and the wafer substrate edge. The immersion fluid loss and waste are minimized and the fluid flow dynamics within the immersion area 309 and the immersion fluid reservoir loop are consistent and stable. It is also understood that the seal ring 318 coverage upon the outer edge of the wafer substrate 306 also prevents particulates located at the edge of the wafer substrate 306 from contaminating the immersion fluid and wafer substrate 306 surface. As a result, the immersion fluid and the immersion area 308 remain clean, free of the particulates, which could distort and disturb the immersion lithography process. The benefits of sealing and covering the particulates under the seal ring would also help to prevent free particulates from adhering upon the interior wafer substrate surface to cause harm during subsequent processing operations. Similarly, the bubbles formed due to turbulence are no longer created, and overlay inaccuracy due to uneven cooling of the wafer is also avoided.

FIG. 4 illustrates another example of the seal ring installed upon the immersion lithography system in accordance with the present disclosure. The immersion printing section 400 of the lithography system is shown with the movable wafer chuck/stage 402 incorporated with vacuum channels 404 for holding and fixing the photoresist coated wafer 406 onto the top of the wafer stage 402. The wafer chuck/stage 402 is constructed with a double step recess from the top surface. The first step recess 405 of the wafer chuck/stage 402 double step recess, is constructed with a recess approximately matching the circumference and thickness of the wafer substrate 406 to accommodate the placement of the wafer such that the top surface of the wafer is leveled and flushed (or co-planar) to the top surface of the first step recess area. The second step recess 407 is constructed such that the seal ring 418 can be placed within the circumference of the recess, such that the seal ring 418 is in contact with the outer edge of the wafer substrate 406, overlapping and also in contact with a small portion 409 of the second step recess of the wafer chuck/stage 402 that is located adjacent to the wafer. The depth of the second step recess 407 is sized such that the top of the placed seal ring 418 is leveled and flushed (or co-planar) to the outer edge, top surface of the non-recessed areas of the wafer chuck/stage 402.

The immersion fluid 408 is shown located near the edge of the wafer substrate 406 to perform processing upon the photoresist areas. The immersion fluid 408 is located on top of the photoresist coated wafer 406, comprised of the immersion fluid displacing at least a partial volume of space between the wafer and the last objective lens element 410. The double step structure of the wafer chuck/stage recess allows for the seal ring 418 to seal the immersion fluid within the immersion area 408. The illustration of FIG. 4 also shows that additional outward flow of the immersion fluid is also eliminated. The example of FIG. 4 is also very effective for controlling the usage and flow of the immersion fluid within the immersion lithography system, as well as the minimization of wafer edge particulate contamination introduced into the immersion lithography system and onto the wafer substrate surface.

It is further noted that the designs and styles of the wafer chuck/stages and seal ring may vary as long as effective sealing of the immersion area and immersion fluids are obtained. As an example, a flexible seal ring may be designed and constructed such that the ring extends beyond the coverage of the wafer chuck/stage and extending downward to partially cover or shield the chuck/stage (not illustrated). Another design may allow a semi-rigid, very smooth seal ring to be placed onto a smaller diameter wafer chuck/stage such that the seal ring extends on the same plane far beyond the outer edge of the wafer chuck/stage (also not illustrated).

The disclosed seal ring can be placed upon and retrieved from the wafer substrate and wafer chuck/stage by the use of a disclosed seal ring carrier device. The disclosed seal ring carrier is incorporated within the immersion printing section of the immersion lithography system as an extendable, retractable arm that is moved into a position aligned directly over the seal ring for the placement and removal of the same. Once positioned directly over the seal ring, the arm of the seal ring carrier may move vertically for either placement or removal of the seal ring from the wafer chuck/stage. When the arm of the seal ring carrier is in a position with an attached seal ring off of the wafer chuck/stage, the seal ring arm and carrier may retract and move to another position away from the wafer stage/chuck to perform the storage or alternative placement of the seal ring. There are vacuum channels constructed within the seal ring carrier, which opens up to small vacuum ports at certain locations for attaching, picking up and transferring of the seal ring by the vacuum force.

FIG. 5 illustrates a cross-sectional view of an example of the disclosed seal ring carrier assembly incorporated into an immersion lens lithography system in accordance to the present disclosure. The wafer chuck/stage 400 assembly is shown with a seal ring 418 having been placed into its processing position on the top surface of the wafer chuck/stage 402 and the wafer substrate 406 surface. The seal ring carrier assembly 500 is shown in position aligned directly above the seal ring 418. The seal ring transport assembly 500 comprises of a seal ring carrier 502 attached onto a seal ring arm 504. There are vacuum channels 506 located within the seal ring arm 504 and the seal ring carrier 502. There are seal ring contact points 508 located on certain locations of the seal ring carrier with open ports for applying the channeled vacuum force to attach, pickup and move the seal ring 418 when the seal ring arm 504 of the seal ring carrier 502 is moved to be in contact with the seal ring. It is noted that the seal ring carrier assembly 500 can be extended and retracted on the same x-y plane. Once placed into the predetermined, extended position, the seal ring carrier assembly 500 can be moved up and down in the vertical or z-axis direction to contact with the seal ring 418. The seal ring transport assembly 500 may also be used to move the seal ring 418 into a storage location or some other location away from the wafer chuck/stage assembly 400.

Figure 6A:
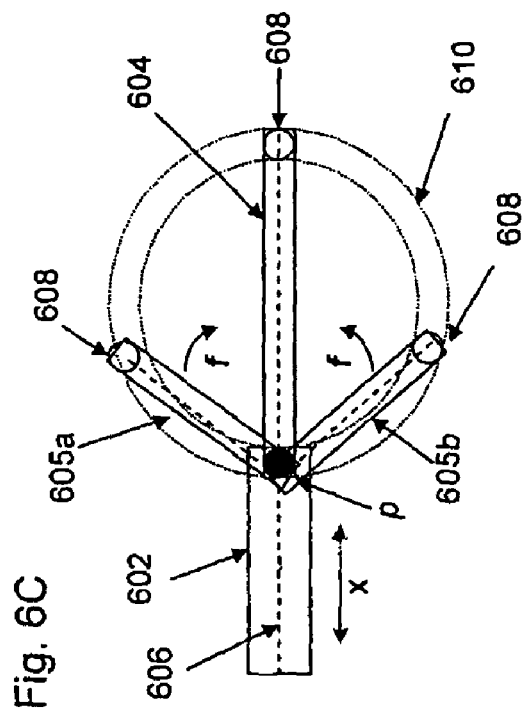
FIGS. 6A through 6D are bottom views of the disclosed seal ring carrier for an immersion lithography system according to several examples of the present disclosure.

FIGS. 6A through 6D illustrate bottom views of several different examples of the disclosed seal ring carrier in accordance with the present disclosure. The following described seal ring carrier designs, 6A through 6D, all function as previously described, yet each design features a uniquely different physical construction and/or shape. FIG. 6A is a seal ring carrier constructed as a ring structure. There is a seal ring carrier arm 602 by which a ring-shaped seal ring carrier 604 is attached to its end. The ring-shaped seal ring carrier 604 is sized such that the seal ring carrier's circumferences and diameters are approximately the same as the seal ring. There are vacuum channels 606 constructed within the seal ring carrier arm 602 and seal ring carrier 604 to distribute and route vacuum to the small vacuum port openings 608 located on the certain seal ring contact locations of the seal ring carrier 604.

Figure 6B:
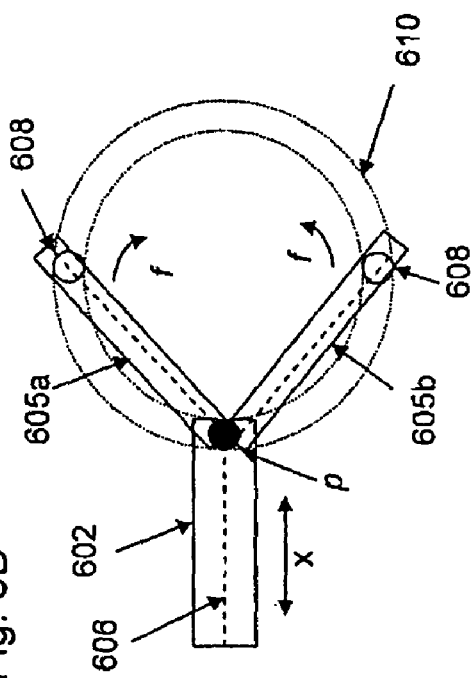

FIG. 6B is a seal carrier constructed as a foldable cross structure. There is a seal ring carrier arm 602 by which a foldable cross structure seal ring carrier, comprised of one fixed arm 604 and one foldable arm 605 is attached to the seal ring carrier arm's 602 end. The one foldable arm 605 is unfolded to a position such that its axis is perpendicular to the axis of the fixed arm 604, forming a cross shape when the seal ring carrier arm 602 is extended to its operation position. There are vacuum channels 606 constructed within the seal ring carrier arm 602 and the two cross arms 604 and 605 of the seal ring carrier to distribute and route vacuum to the small vacuum port openings 608 located on the certain seal ring contact locations of the seal ring carrier arms 604 and 605. The configurations of the seal carrier arms 604 and 605 and placements of the vacuum port openings 608 are such that the port openings may obtain contact with the seal ring 610. It is noted that the movable seal carrier arm 605 is moved and aligned into the unfolded position for picking up and moving the seal ring 610. The folded position of the movable cross arm 605 is such that the folding arm 605 is folded in the directions f at a pivot point p to align the folded arm 605. The folding feature of this seal ring carrier design allows for the seal ring carrier to obtain a smaller, compact hardware profile for its storage and movements within the immersion lithography system.

Figure 6C:
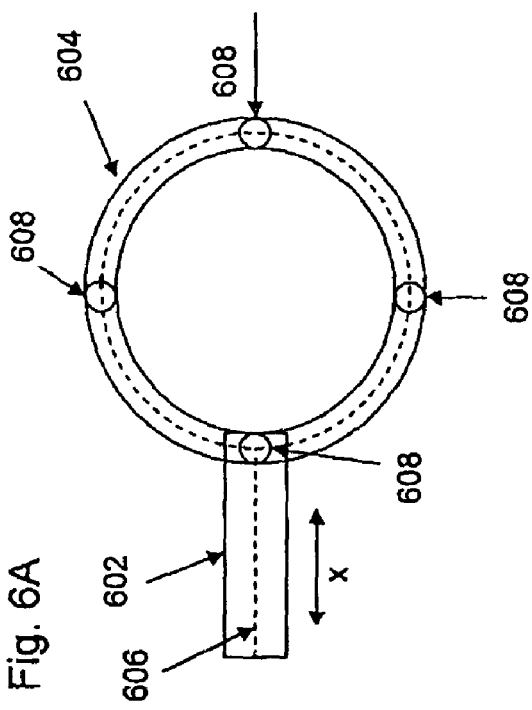

FIG. 6C is a seal carrier constructed as another foldable structure design. There is a seal ring carrier arm 602 by which a foldable structure seal ring carrier, comprised of one fixed arm 604 and two foldable arms 605a and 605b are attached to the seal ring carrier arm 602. There are also vacuum channels 606 constructed within the seal ring carrier arm 602 and the two foldable arms 605a and 605b such that their small vacuum port openings 608 are aligned to a ring shape with circumferences and diameters approximately the same as the seal ring 610. The two foldable arms 605a and 605b are not necessarily of like lengths and dimensions, but are folded at a pivot point p located at the end attaching the seal ring carrier arm 602. Each foldable arm 605a or 605b, unfolds to their operating positions upon extension of the seal ring carrier arm 602 to its operating position. When the seal ring carrier arm 602 needs to be retracted, the two foldable arms 605a and 605b fold inward in the directions f starting at the pivot point p to align the folded arms either on top of or below the fixed arm 604. The folding seal ring carrier design of FIG. 6C also allows for the seal ring carrier to obtain a smaller, compact hardware profile for its storage and movements within the immersion lithography system.

Figure 6D:
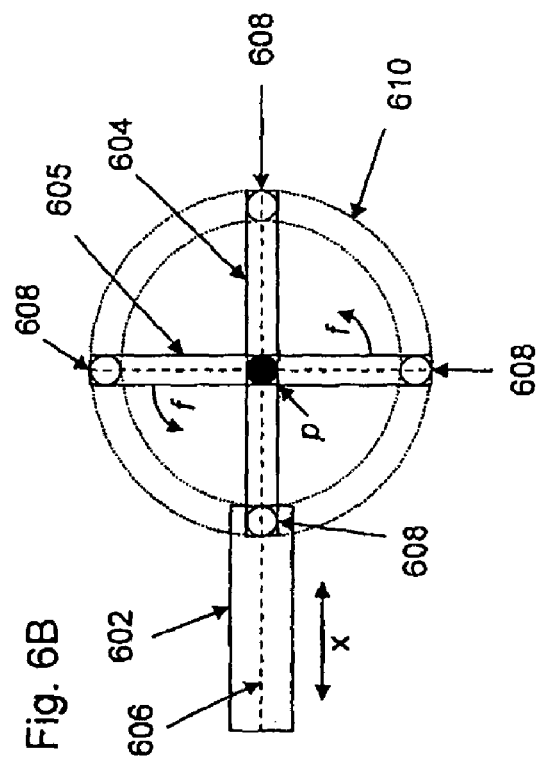

FIG. 6D illustrates a seal carrier that has no fixed arms and only two foldable arms 605a and 605b. As with the foldable arms of the FIG. 6C example, the two foldable arms 605a and 605b, each may fold inward in the directions f at a pivot point p located at the end attached to the seal ring carrier arm 602. This example features fewer vacuum attachment openings and fewer arms to help demonstrate the flexibility of various seal arm and seal carrier designs. The presented examples of various seal arms and seal carrier designs all perform the required functions of attaching, picking up and the movements of the disclosed seal rings.

Figure 7:
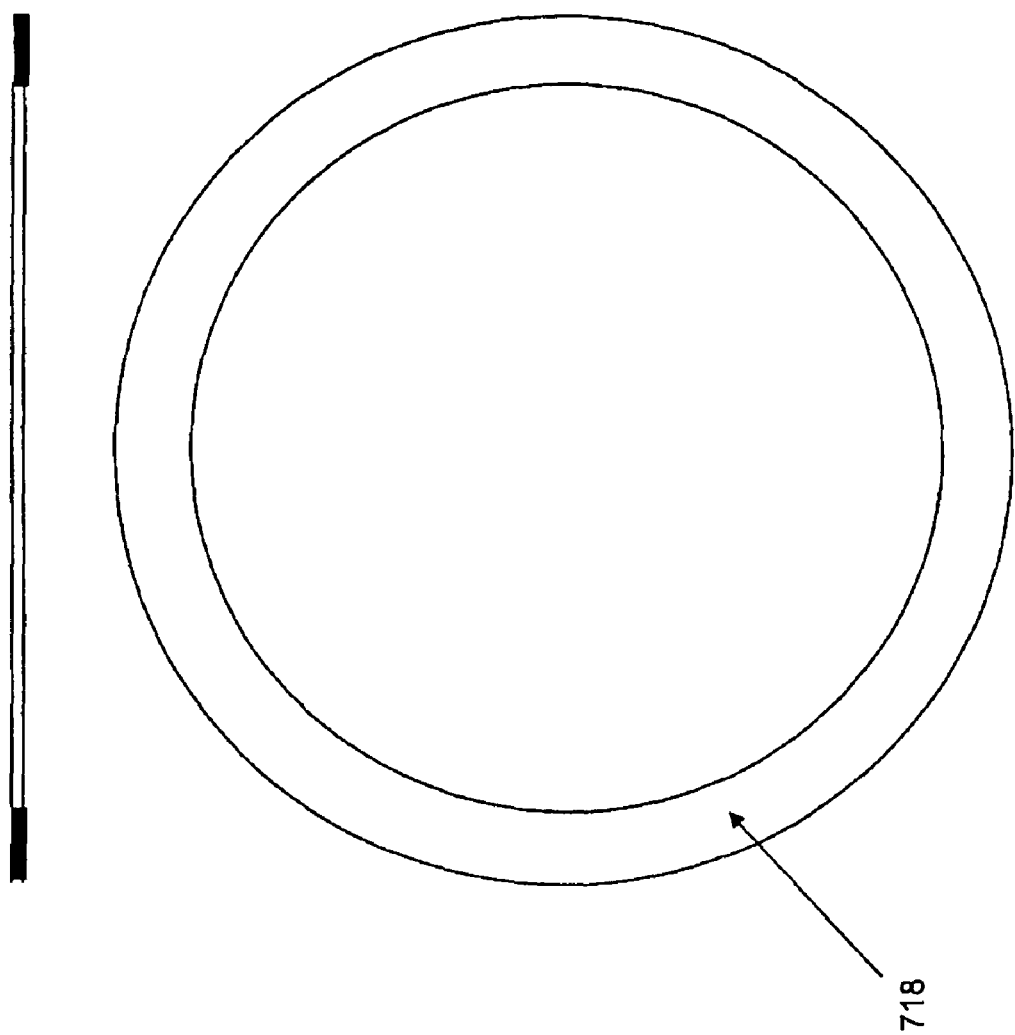
FIG. 7 illustrates a cross-sectional and top view of a seal ring in accordance with an embodiment of the present disclosure.

FIG. 7 respectively illustrates a side view and a top view of a seal ring 718 in the upper and lower portions of the figure. The seal ring device of the present disclosure is a thin ring made of an elastic material such as rubber, plastic, Mylar, Delrin, Teflon, or of some similar materials that can be used for sealing purposes. In other embodiments, the seal ring is made of a flexible sealing material. The seal ring is constructed such that the thickness of the ring is approximately just smaller than the working distance of the immersion lens, the distance of the space between the wafer substrate surface and the last objective lens element of the light projection system. For example, the thickness can be between fractions of a micrometer to several millimeters. The inner diameter (which defines the open area) of the seal ring is sized such that a portion of the outer edge and circumference of the wafer substrate is covered/masked by the seal ring with the target locations exposed for the immersion lithography processing of the wafer substrate surface. The outer diameter (outer edge) of the seal ring is sized such that it overlaps the outer edge of the wafer substrate with sufficient seal ring material to obtain a contact seal with the portion of the wafer chuck/stage adjacent to the wafer substrate.

Figure 8A:
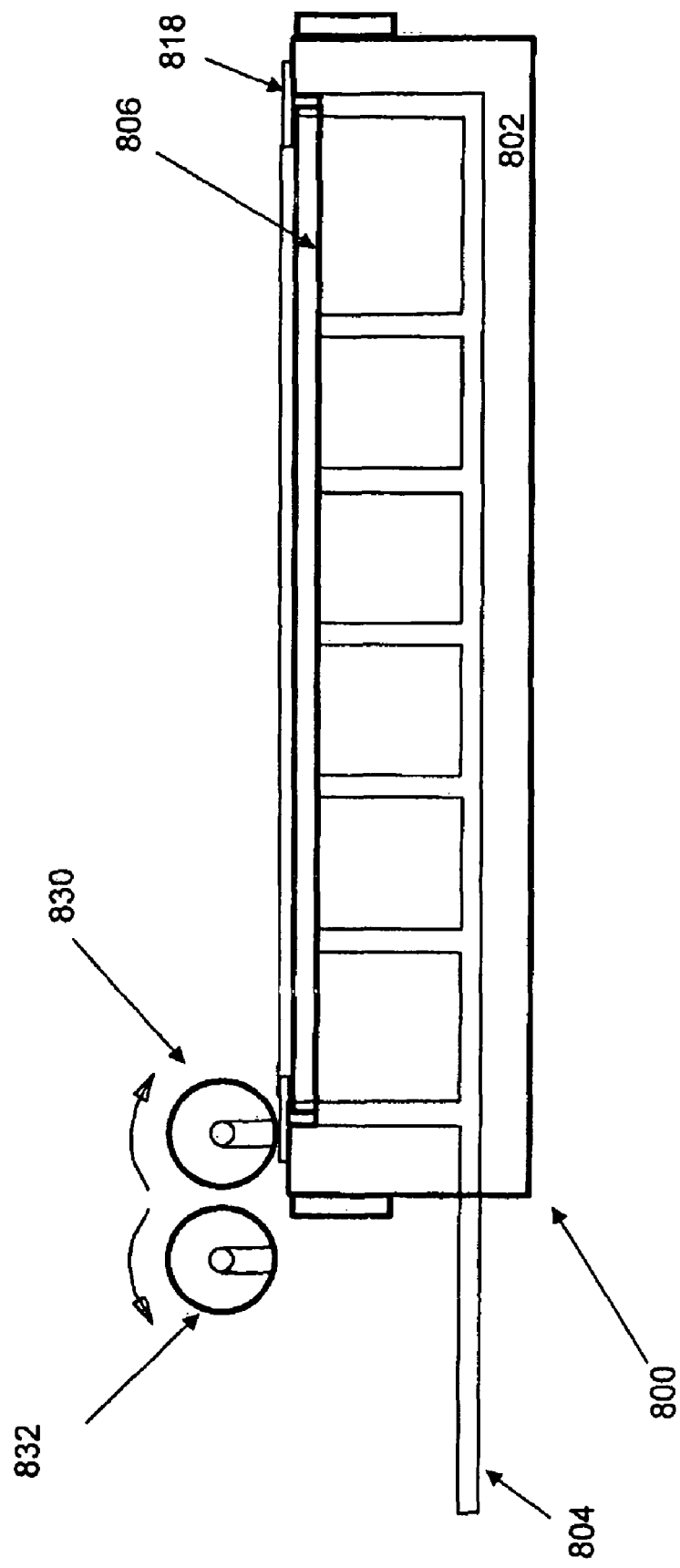

FIG. 8A shows a cross-section view of an immersion lithography system 800. The immersion lithography system contains a movable wafer chuck/stage 802 integrated with vacuum channels 804 for holding and fixing the wafer 806 onto the top of the wafer chuck/stage 802. At a wafer substrate edge, a seal ring 818 has been placed into an operating position on top of the wafer substrate 806 such that the seal ring 818 is in contact with the outer edge of the wafer substrate 806. As in this example, the wafer chuck is recessed to receive the wafer. As such, when the seal ring 818 is placed in an operation position and with the help of the vacuum provided through the vacuum channels 804, it confines the immersion fluid within the immersion area (not shown in FIG. 8). As the seal ring 818 confines the immersion fluid, the flow and usage of the fluid is very well controlled and maintained. A seal ring carrier with two rollers 830 and 832 of the immersion lithography system is adapted to wrap the seal ring 818 during the replacement and cleaning of the seal ring 818. The rollers are positioned at the outer edges of the wafer chuck of the immersion lithography system and are rotated to wrap the seal ring 818 around one of them when needed. When in use, the two rollers can be rotated, driven individually or in synchronized manner to achieve the best result expected. For example, one can be driven, while the other can be a passive follower. The rotation directions of the two rollers are different as marked. That is, one can be rotating clockwise while the other rotates counter clockwise, or vice versa.

Referring to FIGS. 8B, 8C and 8D, a cross-section view of the seal ring carrier is shown in each of them with two rollers for rolling up a seal ring. The first roller 830 and the second roller 832 are respectively pressed on one terminal and another terminal of the seal ring 818. Some vacuum port openings (not shown) can be formed on the surface of the rollers 830 and 832 for adhering the seal ring 818 to the roller during the rolling of the seal ring. Referring to FIG. 8C, it illustrates that the seal ring 818 is rolled up and wrapped around one roller, e.g., roller 830. An alternative to using vacuum, the top surface of the ring can be attached to a piece of tape or similar material so that it makes it easier to roll up.

As stated above, in one embodiment of the present disclosure, the rollers 830 and 832 are individually driven to wrap the seal ring 818 around one of them. The first one of the rollers is actively driven and the second one follows the first one to roll up the seal ring. When one of the rollers is not driven and follows another one, the rotation speed of the two rollers is adjusted so that the linear speed of the second roller is equal to that between the second roller and the seal ring.

In another embodiment of the present disclosure as shown in FIG. 8D, the two rollers 830 and 832 are connected through a spring 840 for adjusting or maintaining the relative position of the rollers. In another embodiment of the present disclosure, the two rollers 830 and 832 can be synchronously driven during the wrapping process of the seal ring.

Referring to FIGS. 8E and 8F, one side and one bottom views of the roller are shown. A vacuum port opening A is further shown in FIG. 8F. The opening A is connected to a vacuum channel (shown by the dotted lines) of an immersion lithography system to adhere a seal ring during wrapping. Other openings along the periphery of the roller that are similar to the opening A can be arranged to enhance the adhesion of the ring to the roller. A lifting structure (not shown) can be connected to the axial of the roller 850 and controls the rotation direction, rotation velocity and position of the roller 850. The lifting structure of the roller 850 for an immersion lithography system can be similar to the carrier arm 602 shown in FIGS. 6A to 6D.

Figure 9:
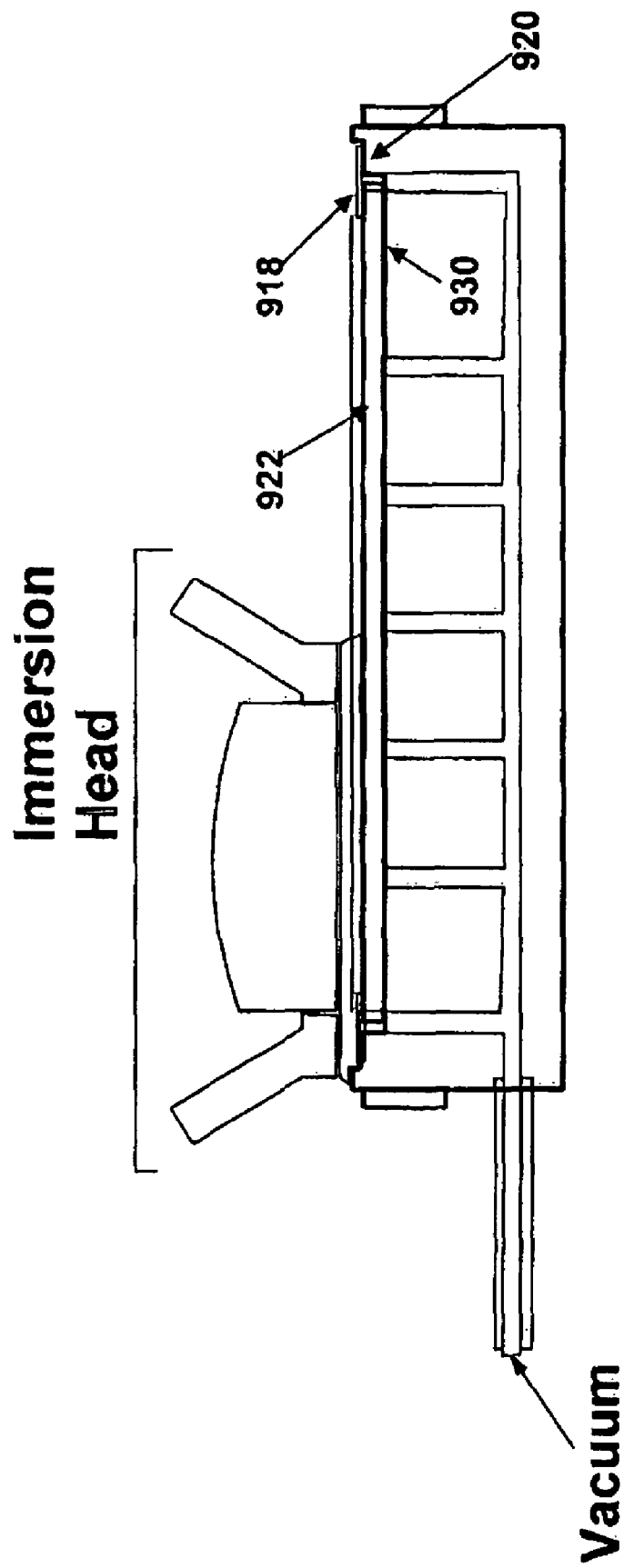
FIG. 9 illustrates a cross-section view of an immersion lithography system with a seal ring in accordance with another embodiment of the present disclosure.

FIG. 9 illustrates a cross-section view of an immersion lithography system according to another embodiment of the present invention. The system shown here is very similar to the one shown in FIG. 8A with some modifications. In this arrangement, a seal ring 918 is also used, but is placed on a first recessed area 920 of the wafer chuck. The wafer chuck also has a second recessed area 930 with a surface ever lower than that of the first recessed area for supporting the wafer. The vertical distance is such that once the wafer is placed in the second recessed area, its top surface is substantially aligned or coplanary with the surface of the first recessed area 920 so that once the seal ring is place thereon, it has a perfect surface to seal on when the vacuum is applied.

Figure 10:
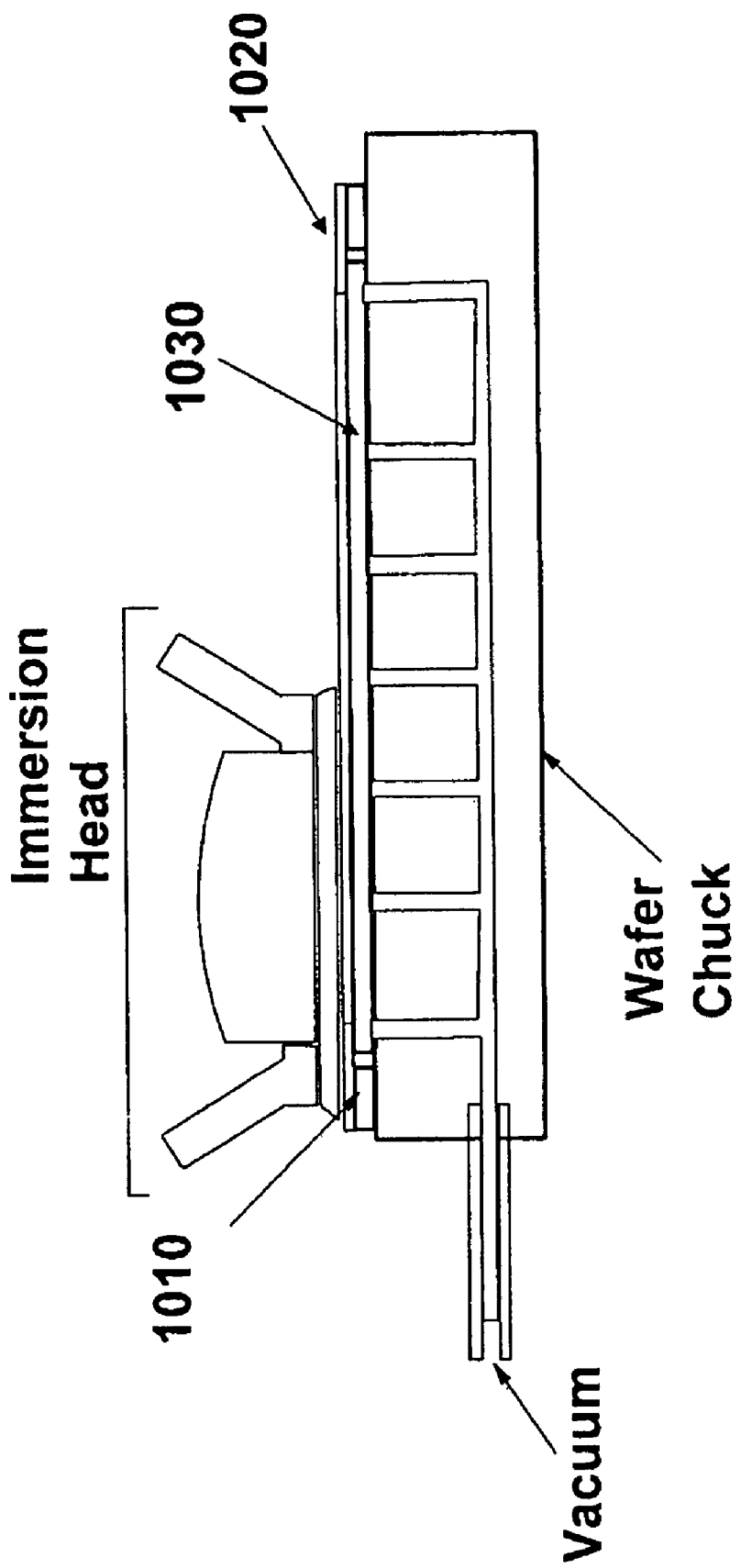
FIG. 10 illustrates a cross-section view of an immersion lithography system with a seal ring and a seal ring supporting frame in accordance with another embodiment of the present disclosure.

FIG. 10 illustrates another cross-section view of an immersion lithography system according to another embodiment of the present invention. The system shown here is very similar to the one shown in FIG. 9 with some modifications. In this configuration, the wafer chuck does not necessarily have a recessed area, but a seal ring supporting frame 1010 is used for placing, positioning, and removing the seal ring 1020. The seal ring supporting frame 1010 provides a distance between the surface of the chuck and the seal ring 1020 so that the wafer 1030 can be placed between them. As shown, the surface of the seal ring supporting frame and the top surface of the wafer are substantially aligned or coplanary so that once the seal ring 1020 is placed down and the vacuum is applied, the sealing can be sufficient. It is understood that the seal ring supporting frame can in a shape of a full circular ring just like the seal ring, but can also be multiple pieces of circular partial-ring-shape components as long as they provide appropriate support to the seal ring. It is also contemplated that the seal ring 1020 can be attached to the seal ring supporting frame 1010 by various ways depending on particular engineering designs, as long as the supporting frame can be the component that is used for easily handling the seal ring for loading and/or unloading purposes. For instance, in the easiest form, the seal ring may be glued to the seal ring supporting frame. Or, the seal ring is fastened to the supporting frame by other means such as mechanical clamping or vacuum force introduced externally.

Figure 11:
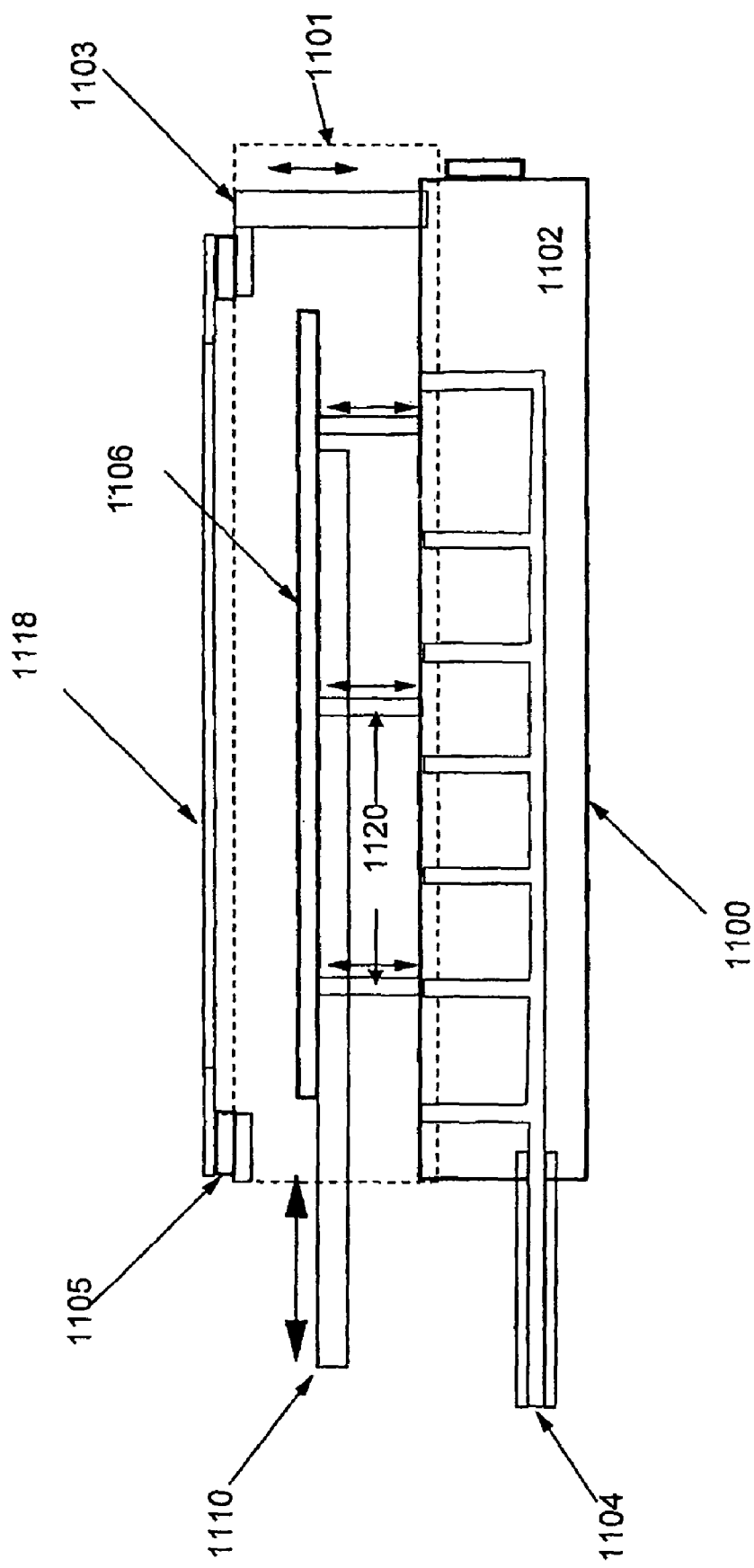
FIG. 11 is a cross-sectional view of an immersion lithography system illustrating an operation of the immersion lithography system when the seal-ring is lifted from the wafer chuck in accordance with embodiments of the present disclosure.

FIG. 11 shows a schematic cross-section view of an immersion lithography system 1100, which includes a seal ring carrier 1101. The wafer chuck 1102 is equipped with vacuum channels 1104 for holding and fixing the wafer 1106 onto the top of the wafer chuck/stage 1102. Around a wafer substrate 1106, a seal ring 1118 can be placed on top of the wafer substrate 1106 surface. Ideally, the supporting frame 1105 of the seal ring 1118 will not overlap with any part of the wafer substrate. The seal ring carrier 1101 includes a lifting arm 1103, and the lifting arm may have necessary components to fit under a supporting frame 1105 for lifting the same. Once the seal ring 1118 is attached to the supporting frame 1105, it can be lifted by the seal ring carrier 1101 and moved to be placed on the wafer substrate 1106. The seal ring carrier 1101 may have a vacuum subsystem built therein so that vacuum can be applied through the lifting arm to the seal ring supporting frame to make sure that the seal ring is firmly attached thereto while moving by the seal ring carrier. According to one embodiment of the present disclosure, the supporting frame 1105 is of a ring shape as well, and has a larger inner diameter than that of the seal ring 1118 and the diameter of the wafer 1106. Therefore, it leaves with enough space for the seal ring to be placed on the wafer without contacting the wafer itself. The wafer 1106 is put on a wafer handler 1110 such as a robot arm of the immersion lithography system. The wafer handler 1110 can fetch and place or remove the wafer on the wafer chuck 1102. Together with the seal ring carrier 1101, the wafer and the seal ring can be put in operation. For example, before the seal ring is cleaned or replaced, the vacuum is released. The lifting arm 1103 vertically raises the supporting frame 1105 to lift the seal ring 1118 off from the wafer 1106. A set of support elements such as a group of pins 1120, which normally are "hidden" within corresponding recesses in the chuck body, will push up and take the wafer off from the surface that it lies on. Afterwards, the robot arm 1110 comes in and moves the wafer 1106 away. Similarly, the reverse sequence can be performed to load the wafer onto the chuck and then place the seal ring by the seal ring carrier on top of the wafer. Thereafter, the vacuum can be applied to seal the system.

Figure 12:
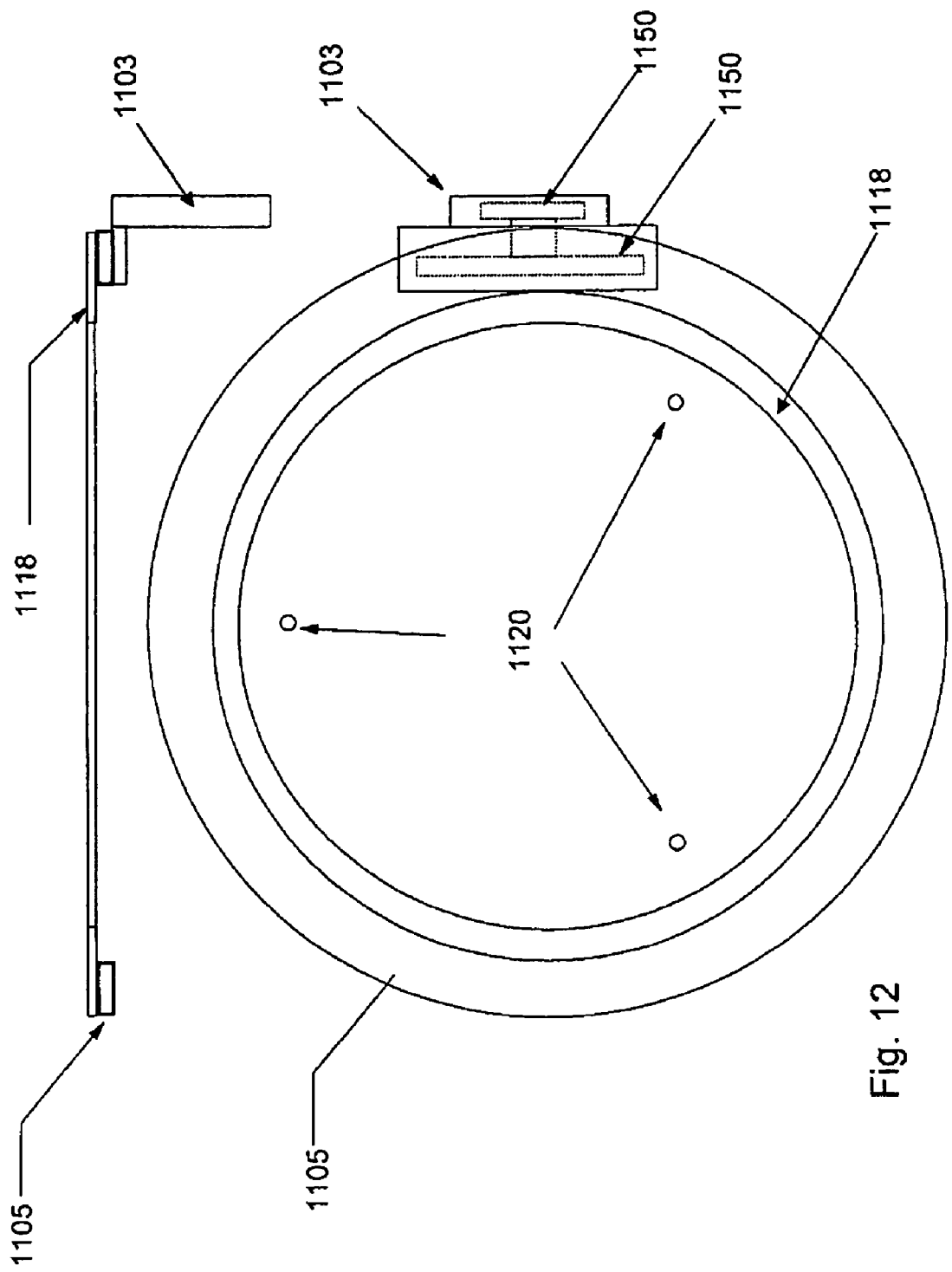
FIG. 12 illustrates the top view and side view of a seal-ring and its carrier in accordance with the embodiment shown in FIG. 11.

Referring to FIG. 12, a cross-section view and a bottom view of the seal ring carrier 1101 as shown in FIG. 11 are further illustrated. The seal ring 1118 is mounted on the seal ring supporting frame 1105, which is attached to the lifting arm 1103. One of the preferred ways is to hold the seal ring supporting frame 1105 to the lifting arm 1103 with vacuum. As shown in FIG. 12, the inner diameter of the seal ring 1118 is smaller than that of the supporting frame 1105 so that it can be lifted by the seal ring supporting frame 1105. Further shown in this figure are three supporting pins 1120. Obviously, the locations and the number of these pins can vary.

Figure 13:
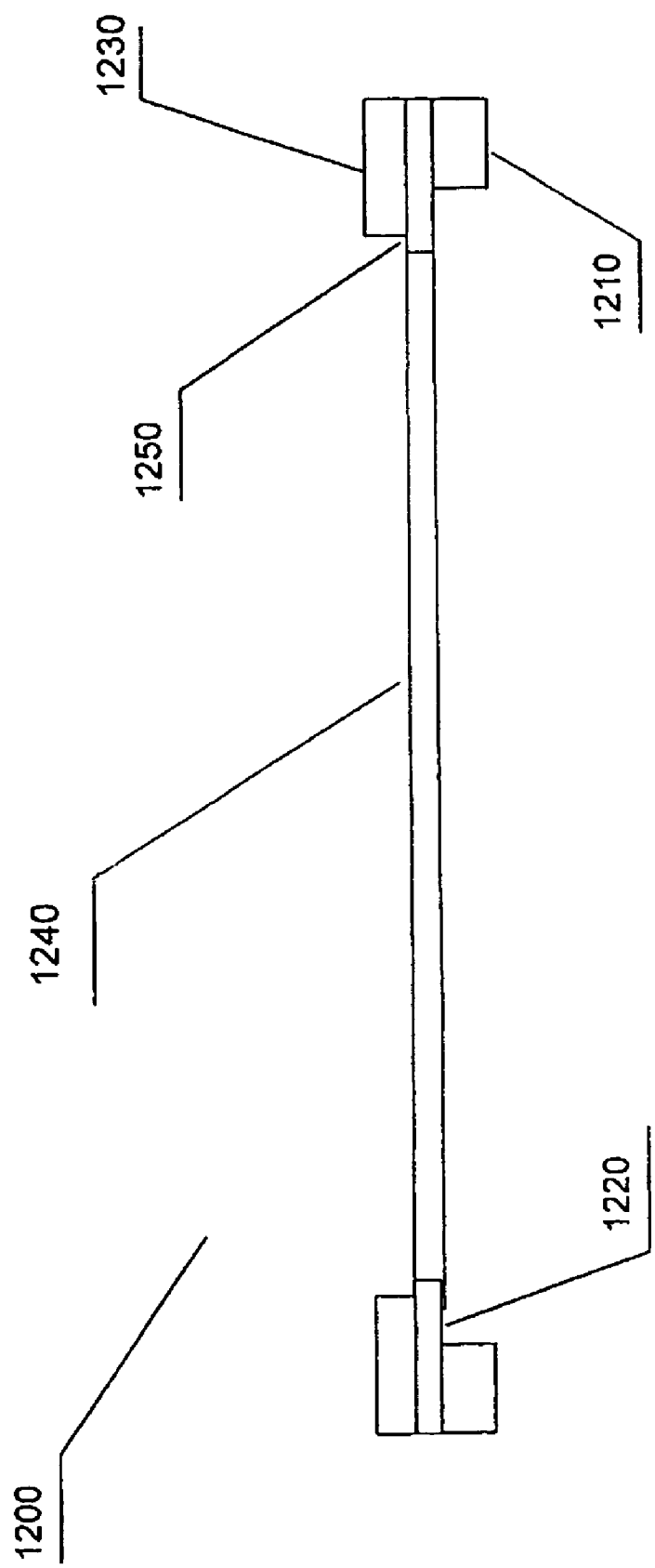
FIG. 13 illustrates a seal ring arrangement with a re-enforcing ring according to another embodiment of the present disclosure.

FIG. 13 illustrates another seal ring configuration with a re-enforcing ring according to another embodiment of the present disclosure. The seal ring system 1200 has a seal ring frame 1210, and a seal ring 1220 as described above. On top of the seal ring, a re-enforcing ring 1230 is placed and is intended to hold the seal ring in place, and protects the seal ring against any pressure (whether from any fluid or air) coming from the top surface of the seal ring. The seal ring 1220 holds the wafer 1240 down at the desired position for immersion lithography. The re-enforcing ring 1230 can be made of a more stiff or rigid material than the seal ring itself. For example, it can be made of metal or plastic, etc., as its primary function is to hold the seal ring down on the seal ring frame. Moreover, the re-enforcing ring does not have the exactly same shape as the seal ring as long as it can serve its purpose. For instance, it does not have to be a complete circular ring if two or more separate circular components can serve the purpose. It is further noticed that there can be a small recess (or difference) 1250 between the re-enforcing ring and the seal ring so that the relatively hard surface of the re-enforcing ring does not potentially damage any part of the wafer when loading and unloading processes are performed. This means that the re-enforcing ring (or different ring pieces) can have a larger inner diameter than that of the seal ring. The thickness of the re-enforcing ring can be between 20 to 200 micrometers. However, the thickness may vary depending on the material used for making the re-enforcing ring.

The disclosed system and method of using the disclosed seal ring and seal ring carrier provides an effective means for the containment of the immersion fluid-during the immersion lithography exposure processing. The placement of an elastic seal ring onto the edge of the wafer substrate surface and the wafer chuck/stage perimeter facilitates the containment of the immersion fluid to the wafer substrate and immersion fluid reservoirs at the wafer substrate edge throughout the entire immersion lithography processing operation. The disclosed seal ring is placed and removed from its operating position through the use of a disclosed seal ring carrier device. The immersion fluid is controlled, and conserved without much waste and loss. Additionally, the use of the disclosed seal ring, especially with the additional re-enforcing ring, also minimizes the introduction of particulates into the immersion fluid by preventing the immersion fluid from contacting the covered wafer edge. The use of the seal ring also improves overlay accuracy. As result, the immersion lithography and subsequent processing operations achieve a higher level of quality and integrity, and generating photoresist images and patterns of less distortion and defectivity.

The present disclosure provides several examples to illustrate the flexibility of how the disclosed seal ring and seal ring carrier may be implemented. The disclosed methods and devices may be easily implemented into existing system designs and flows as well as into their fabrication facilities and operations. The methods and devices of the present disclosure may also be implemented into present advanced technology immersion lithography systems utilizing 150 nm to 450 nm exposing light wavelengths, as well as future systems utilizing even shorter wavelengths. The disclosed methods and specified system will allow for the manufacturing of advanced semiconductor devices of high reliability, high performance and high quality.

The above disclosure provides many different embodiments or examples for implementing different features of the disclosure. Specific examples of components and processes are described to help clarify the disclosure. These are, of course, merely examples and are not intended to limit the disclosure from that described in the claims.

Although the invention is illustrated and described herein as embodied in a design for performing immersion lithography, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the disclosure, as set forth in the following claims.

What is claimed is:

1. A sealing apparatus for use during an immersion lithographic process, the sealing apparatus comprising:
    a wafer platform for holding up a wafer;
    a first circular seal ring covering a predetermined portion of the wafer peripheral area for preventing an immersion fluid from leaking through the covered portion of the wafer peripheral area during the immersion lithographic process;
    a roller module for rolling up the first circular seal ring when the first circular seal ring is not in use; and
    a flat ring surface substantially in parallel to the wafer platform, the flat ring surface surrounding the wafer on the wafer platform and supporting a predetermined portion of the first circular seal ring overlaying the edge of the wafer.

2. The sealing apparatus of claim 1, wherein the wafer platform uses vacuum force through vacuum channels on its surface to hold the wafer firmly in place during the immersion lithographic process.

3. The sealing apparatus of claim 1, wherein the first circular seal ring is made of a material selected from the group consisting of rubber, plastic, Mylar, Delrin, Teflon, and a combination thereof.

4. The sealing apparatus of claim 1, wherein the first circular seal ring is made of a flexible sealing material.

5. The sealing apparatus of claim 1, wherein the first circular seal ring is elastic.

6. The sealing apparatus of claim 1, wherein the first circular seal ring is attached to the flat ring surface.

7. The sealing apparatus of claim 6 further comprising a second circular seal ring pressing the first circular seal ring to the flat ring surface.

8. The sealing apparatus of claim 1, wherein the flat ring surface belongs to a member that moves upward carrying the first circular seal ring away from the wafer after the immersion lithographic process.

9. A method for sealing the peripheral area of a wafer during an immersion lithographic process, the method comprising:
  holding the wafer to a predetermined position;
  placing a first circular seal ring covering a predetermined portion of the wafer peripheral area for preventing an immersion fluid from leakage through the covered portion of the wafer peripheral area during the immersion lithographic process;
  rolling up the first circular seal ring when the first circular seal ring is not in use; and
  providing a flat ring surface substantially in parallel to the wafer surface, the flat ring surface surrounding the wafer and supporting a predetermined portion of the first circular seal ring overlaying the edge of the wafer.

10. The method of claim 9, wherein the holding of the wafer comprises using vacuum force to hold the wafer firmly against a wafer platform during the immersion lithographic process.

11. The method of claim 9, wherein the first circular seal ring is made of a material selected from the group consisting of rubber, plastic, Mylar, Delrin, Teflon, and a combination thereof.

12. The method of claim 9, wherein the first circular seal ring is made of a flexible sealing material.

13. The method of claim 9, wherein the first circular seal ring is elastic.

14. The method of claim 9, wherein the holding of the wafer comprises insuring the wafer surface and the flat ring surface are in substantially the same plane.

15. The method of claim 9 further comprising attaching the first circular seal ring to the flat ring surface.

16. The method of claim 15 further comprising pressing a second circular seal ring onto the first circular seal ring for securing the first circular seal ring onto the flat ring surface.

17. The method of claim 9 further comprising lifting the flat ring surface along with the first circular seal ring away from the wafer after the immersion lithographic process.

* * * * *